(12) United States Patent
Licht

(10) Patent No.: US 6,993,298 B2
(45) Date of Patent: Jan. 31, 2006

(54) PROGRAMMABLE CONTROLLER WITH RF WIRELESS INTERFACE

(75) Inventor: Harold Jay Licht, Johnson City, TN (US)

(73) Assignee: Siemens Energy & Automation, Inc., Alpharetta, GA (US)

( * ) Notice: Subject to any disclaimer, the term of this patent is extended or adjusted under 35 U.S.C. 154(b) by 470 days.

(21) Appl. No.: 09/948,421

(22) Filed: Sep. 7, 2001

(65) Prior Publication Data

US 2003/0050093 A1 Mar. 13, 2003

(51) Int. Cl.
*H04B 1/38* (2006.01)

(52) U.S. Cl. .............. 455/90.3; 455/550.1; 455/575.1; 257/275; 257/273; 439/59

(58) Field of Classification Search .............. 455/90.3, 455/90.2, 575.1, 575.5, 129, 67.11, 79; 156/226; 340/572.1, 572.5, 572.8; 257/275, 273; 439/59
See application file for complete search history.

(56) References Cited

U.S. PATENT DOCUMENTS

| 5,214,621 | A | * | 5/1993 | Maggelet et al. | 361/752 |
| 6,078,791 | A | * | 6/2000 | Tuttle et al. | 455/90.1 |
| 6,118,379 | A | * | 9/2000 | Kodukula et al. | 340/572.8 |
| 6,195,053 | B1 | * | 2/2001 | Kodukula et al. | 343/702 |
| 6,371,380 | B1 | * | 4/2002 | Tanimura | 235/492 |
| 6,375,780 | B1 | * | 4/2002 | Tuttle et al. | 156/226 |
| 6,459,376 | B2 | * | 10/2002 | Trosper | 340/571 |
| 6,509,829 | B1 | * | 1/2003 | Tuttle | 340/10.1 |
| 6,542,720 | B1 | * | 4/2003 | Tandy | 257/725 |
| 6,542,721 | B2 | * | 4/2003 | Boesen | 455/553.1 |
| 6,847,916 | B1 | * | 1/2005 | Ying | 702/183 |
| 2001/0003163 | A1 | | 6/2001 | Bungert et al. | |
| 2001/0034257 | A1 | * | 10/2001 | Weston et al. | 463/1 |
| 2002/0030264 | A1 | * | 3/2002 | Shimada et al. | 257/692 |
| 2002/0189091 | A1 | * | 12/2002 | Ding et al. | 29/840 |

FOREIGN PATENT DOCUMENTS

| EP | 0 926 426 A1 | 6/1999 |
| EP | 0 994 350 A1 | 4/2000 |
| EP | DE 199 51 233 A1 | 5/2000 |
| EP | DE 100 32 866 A1 | 1/2002 |
| EP | DE 100 32 868 A1 | 1/2002 |
| EP | DE 100 33 335 A1 | 1/2002 |
| JP | 11-007310 | * 12/1999 |

OTHER PUBLICATIONS

"Incorporating Radio Frequency Communication into a Computer Integrated Manufacturing Test Facility", D.S. Zinger, Industry Applications Conference 1995, Oct. 8, 1995, pp. 1874-1878.
European Search Report, Search completed Feb. 3, 2004 (references cited above).

* cited by examiner

*Primary Examiner*—Danh Cong Le

(57) ABSTRACT

A programmable logic controller has a wireless communication interface. A radio frequency identification chip set is mounted to, and is in communication with, the active elements of an integrated circuit on one or more circuit boards in the programmable controller. The chip set provides for radio frequency communication between the controller and other components either inside the controller or external to the controller. Identification information recorded on the chip may be interfaced over a network, particularly, an on-line network such as the Internet.

19 Claims, 3 Drawing Sheets

PROGRAMMABLE CONTROLLER WITH RF WIRELESS INTERFACE

FIELD OF THE INVENTION

The present invention generally concerns communication modules for programmable controllers that are used to control industrial assembly applications. In particular, the invention concerns an interface module employing radio frequency identification (RFID) technology to facilitate wireless communication between the programmable controller and other devices both within the controller and external to the controller.

BACKGROUND OF THE INVENTION

In the field of programmable logic controllers (PLCs), communication between a PLC and other devices, such as external devices, is typically accomplished by electro-mechanical means through a backplane or fixed connector on the PLC. For example, PLCs have traditionally been programmed by transmission of information through a cable that is attached to a program port on the body of the PLC. Such attachment can be cumbersome, unreliable, and relatively costly.

The prior art has in some instances used modems to control, monitor and test/debug PLCs from remote locations. The modem devices are also typically connected to a PLC through the backplane or a fixed connector on the PLC.

Radio frequency identification ("RFID") technology has been used in various fields as a means of identifying articles. RFID technology has been used for identifying parcels, luggage, and other materials. An RFID system generally consists of an antenna; a transmitter/receiver and; a transponder (called an RF chip set or tag) that is electronically programmed with unique identification information. The antenna emits radio signals that activate the RFID tag and write and read data to and from the RFID tag. For example, an antenna mounted on a toll booth may monitor various aspects of traffic by sending RF signals to an RF tag mounted within each passing automobile.

RFID tags are available in many different sizes/shapes and are generally characterized as either passive or active. Active tags are internally powered and are typically readable and writable. Active tags have relatively large amounts of memory. Passive tags operate without an internal power source. Passive tags obtain operating power generated from the reader. Passive tags are typically read-only. RFID systems provide for wireless communication through many materials. RFID tags can also be read at high speeds.

In one example, RFID technology is implemented through an integrated chip set with a PROM for programming an identification (ID) code. The RFID chip set is placed on an article and the ID code may be transmitted to, and stored in, the RFID chip. The ID code is then scanned by a transmitter/receiver. The RFID chip is passive and employs the power of the transmitting signal to energize the RFID coil and to return a signal including the ID code or a signal affirming the ID code.

The use of RFID technology has been limited essentially to identification applications and has not been implemented as a means for transferring data in machines, such as PLCs. It would also be advantageous to have the wireless RFID interface as an integral part of the PLC eliminating the need for communication through the backplane and cables.

SUMMARY OF THE INVENTION

The invention provides a programmable logic controller having a wireless communication interface. The controller generally includes a housing containing one or more circuit boards. The housing typically stores an input module, a central processing unit, and an output module. The controller also includes an interface means for providing wireless communication with said programmable logic controller via radio frequency transmissions. The interface means is mounted to and contacts the active elements of an integrated circuit on one or more of the circuit boards in the controller. For example, a radio frequency identification chip set (or tag) is mounted to and contacts one or more circuit boards in the central processing unit of the controller. The chip set provides for radio frequency communication between the controller and other components within or external to the PLC.

The chip set may be mounted to the circuit board by a standard surface mount, by a through-hole mounting device, or by a chip-on-board mounting device. Any mounting device must connect the chip set to the active elements of the integrated circuit on the circuit board. In one preferred embodiment, the chip set may actually be incorporated into part of the schematic of the integrated circuit. The antenna of the radio frequency chip set is attached to the circuit board by adhesive means or more preferably by etching the antenna directly to the board.

In a particular embodiment, two or more circuit boards within the controller include the chip set, and the boards are capable of radio frequency communication with one another. In another embodiment, the communication interface is provided for transferring programming instructions to the central processing unit by radio frequency communication.

The radio frequency communication of the wireless interface may cause interference with the operation of the controller. To counteract this possibility, the chip set may be shielded, or may be configured to operate in a frequency range outside of the frequencies at which the controller operates.

The invention also provides a method for wireless communication with a PLC. The method is implemented by mounting the RFID chip set to at least one circuit board within the housing of the PLC and providing an antenna at a remote location to enable wireless communication of information between the chip set and the antenna. The method of the invention enables the wireless communication of programming instructions to the controller or of error notification signals from the controller to a remote location.

DETAILED DESCRIPTION OF THE INVENTION

Figure 1:
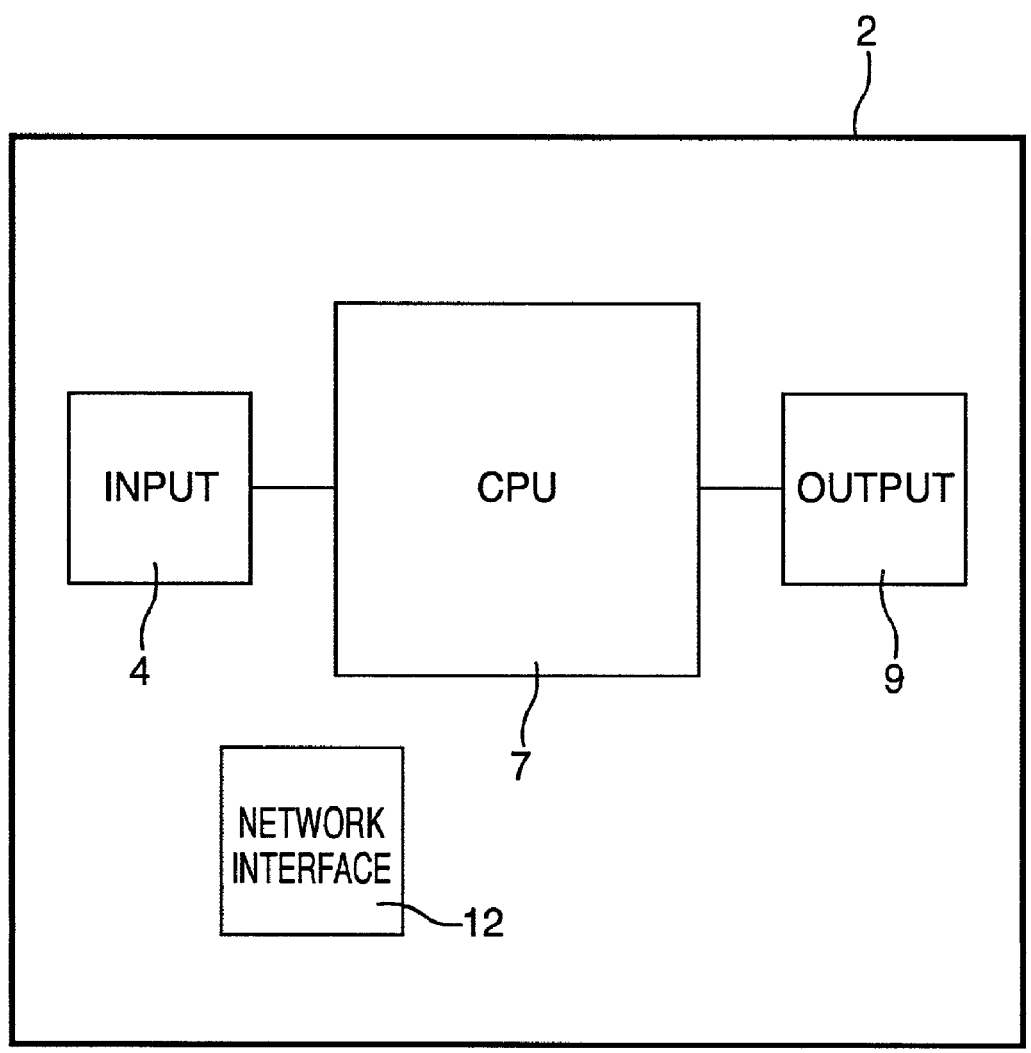
FIG. 1 shows the general construction of a PLC that may embody the wireless communications interface in accordance with the invention.

FIG. 1 shows the PLC of the invention incorporating the wireless communications interface. The PLC includes a housing 2 that contains an input module 4, a central processing unit 7 and an output module 9. The PLC includes one or more circuit boards 11 (See FIG. 2).

Further, a network interface 12 may be provided for connecting the PLC to a network, such as an on-line network as a Local Area Network or the Internet. Information received or stored on the chip, therefore, may be communicated over the network. One skilled in the art of network communications, particularly TCP/IP, will understand readily how such communications are to be implemented.

Figure 2:
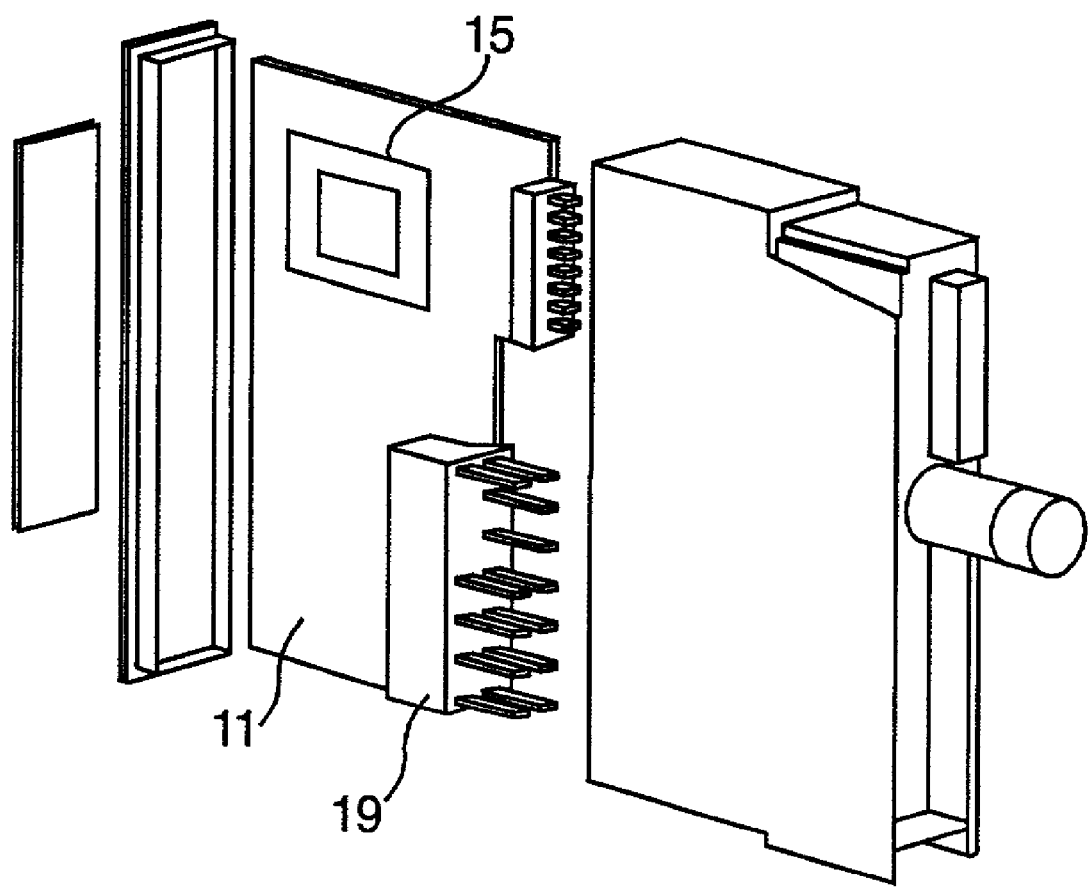
FIG. 2 shows a circuit board of a PLC incorporating a wireless communications interface in accordance with the invention.

As shown in FIG. 2, the wireless interface 15 is to be mounted on a circuit board 11 contained within the housing 2 of the PLC. The wireless interface employs a standard RFID chip set, such as Texas Instruments Tag it®. In a preferred embodiment, the RFID is a passive receiver/transmitter. According to the invention, the RFID chip set 15 is mounted to an integrated circuit on the circuit board 11 of the programmable controller. This will allow separate integrated circuits to be in communication via wireless connection. The RFID chip set 15 may contact the active elements of the integrated circuit by standard surface mount, a through hole mount, or a chip-on-board mount. The RFID chip set 15 may also be a part of the schematic of the integrated circuit.

In addition, integrated circuits equipped with the wireless interface on a board can facilitate communication between the PLC and other devices, such as any of the components in the computer. Thus, the circuit board may communicate wirelessly using radio frequency with other circuit boards similarly equipped with the RFID chip set, without requiring communication through connectors 19.

Figure 3:
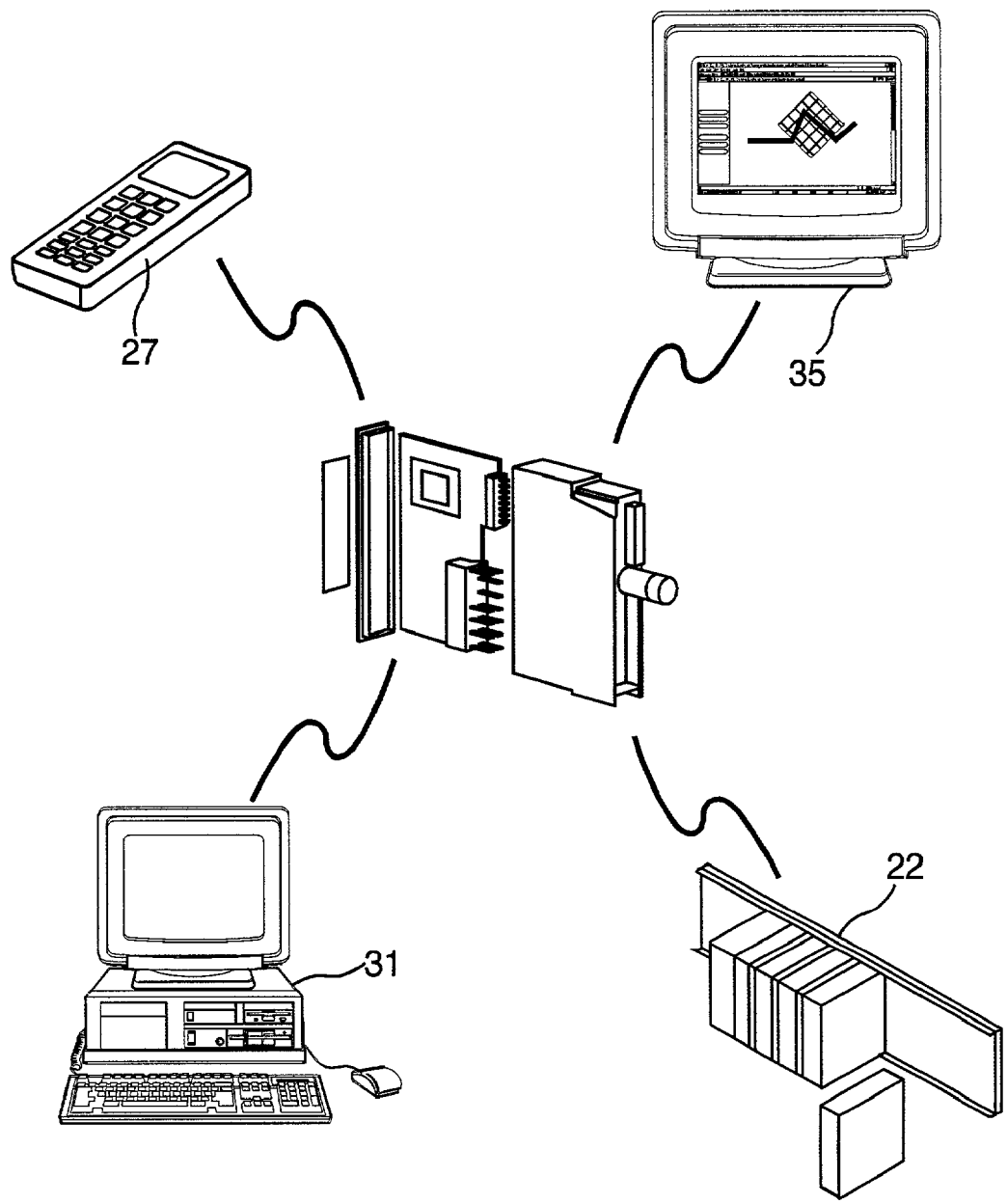
FIG. 3 shows the circuit board of FIG. 2 in various uses employing the wireless communication feature embodied by the invention.

As shown in FIG. 3, with such a modified device, a PLC equipped with the RFID chip set may communicate wirelessly with remotely-located modules such as a card and rack system 22; a programming device, such as a hand held programmer 27; or a computer 31. The concept may also be extended to process automation in general and may be further applicable to other industrial applications. For example, it is contemplated that the invention may be applicable to automotive diagnostics. In this case, the invention may communicate with different areas of a car or may communicate between different devices in an automobile.

As is also shown in FIG. 3, the invention may be employed to perform wireless testing from an operator's terminal 35 during the manufacturing process or to communicate wireless error code messages to a remote computer 31 during operation. This enables quick troubleshooting. In a PLC with numerous modules, the technician is able to locate the problematic module quickly, particularly in a large system where a proliferation of modules may make troubleshooting difficult.

Traditionally, a PLC (such as the S7-200 or S7-300, Siemens Energy & Automation, Johnson City, Tenn.) is programmed using a cable. The dependence upon cables is eliminated so that a programmer in the field need not worry about hardware compatibility issues. PLCs may be programmed via the wireless interface of the invention.

Any possibility of interference with the operation of the PLC caused by the radio frequency nature of the communication by the RFID chip set 15 may be alleviated through suitable shielding. Another way to address this problem is to limit the frequency range of the RFID chip set outside of the normal PLC operating frequencies. Another approach limits the proximity to one another of the RFID's 15 on the modules.

The use of the wireless interface may also create problems in compliance with FCC and CE (EU) regulations. This problem may be overcome by limiting the range of the interface. Limiting the range may be accomplished by use of shielding or reducing the power output.

In addition, the invention may be connected to a microchip or circuitry. The RFID chip set 15 may be etched into the circuit board rather than a stick on label as is the current situation. The RFID chip set 15 is relatively inexpensive and may alleviate connection defects that commonly occur with plug-type connectors in the backplane of the PLC. The RFID should provide a more reliable connection.

Those skilled in the art will realize that numerous modifications and variations of the present invention are possible in light of the above teachings and embodiments. Therefore, the invention should not be construed as limited to any of the foregoing embodiments, but instead should be viewed within the scope of the appended claims.

What is claimed is:

1. A programmable logic controller comprising:
   a housing;
   at least one circuit board within the programmable logic controller housing, the at least one circuit board comprising circuitry for performing controller functions; and
   a radio frequency identification chip set mounted to the at least one of circuit board and coupled to circuitry on the at least one circuit board, the chip set for providing radio frequency communication, wherein the chip set is adapted to operate in a frequency range outside of frequencies at which the programmable logic controller is adapted to operate to prevent radio frequency communication from interfering with the operation of the programmable logic controller.

2. The programmable logic controller according to claim 1, wherein an antenna of the radio frequency chip set is etched into the at least one circuit board.

3. The programmable logic controller according to claim 1, further comprising a chip set mount for mounting the chip set to the at least one circuit board.

4. The programmable logic controller according to claim 3, wherein the chip set mount comprises a standard surface mount.

5. The programmable logic controller according to claim 3, wherein the chip set mount comprises a through-hole mounting device.

6. The programmable logic controller according to claim 3, wherein the chip set mount comprises a chip-on-board mounting device.

7. The programmable logic controller according to claim 1, wherein the chip set comprises part of a schematic of an integrated circuit.

8. The programmable logic controller according to claim 1, wherein two or more circuit boards within the programmable logic controller comprise the chip set and the two or more circuit boards are adapted for radio frequency communication with one another.

9. The programmable logic controller according to claim 1, wherein the programmable logic controller comprises a processor that receives RF signals carrying programming instructions for execution by the processor.

10. The programmable logic controller according to claim 1, wherein the chip set is shielded to prevent radio frequency communication with the chip set from interfering with operation of the programmable logic controller.

11. The programmable logic controller according to claim 1, wherein the chip set carries signals representing wireless testing instructions.

12. The programmable controller according to claim 11, wherein the chip set carries testing signals regarding a manufacturing process.

13. The programmable logic controller according to claim 1, further comprising a network interface for interfacing the programmable logic controller to a network.

14. The programmable logic controller according to claim 13, wherein said network interface communicates information received from said identification chip over said network.

15. The programmable logic controller according to claim 14, wherein said network interface interfaces to the Internet.

16. A programmable logic controller having a wireless communication interface comprising:
   a housing;
   at least one circuit board within said programmable logic controller including circuitry for performing controller functions; and
   interface means for providing wireless communication with said programmable logic controller via radio frequency transmissions, said interface means mounted to and contacting the at least one of the circuit board, wherein the interface means is adapted to operate in a frequency range outside of frequencies at which the programmable logic controller is adapted to operate to prevent wireless communication from interfering with the operation of the programmable logic controller.

17. A method for providing wireless communication with a programmable logic controller, the method comprising:
   providing a radio frequency identification chip set that transmits information via radio frequency signals, wherein said chip set is adapted to operate in a frequency range outside of frequencies at which the programmable logic controller is adapted to operate to prevent radio frequency communication from interfering with the operation of the programmable logic controller,
   mounting said chip set in contacting arrangement to active elements of an integrated circuit on at least one circuit board in the programmable logic controller; and
   providing an antenna for communicating information to and from the chip set.

18. The method of claim 17, wherein the information comprises programming instructions for the programmable logic controller.

19. The method of claim 17, wherein the information comprises error notification signals indicating when there is a problem in the programmable logic controller.

* * * * *